United States Patent
You

(10) Patent No.: US 11,288,484 B2
(45) Date of Patent: Mar. 29, 2022

(54) DISPLAY DEVICE FOR INTEGRATING A SOLAR BATTERY MODULE WITH A FUNCTION OF RECOGNIZING FINGERPRINTS

(71) Applicant: WUHAN CHINA STAR OPTOELECTRONICS SEMICONDUCTOR DISPLAY TECHNOLOGY CO., LTD., Hubei (CN)

(72) Inventor: Weiguo You, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 410 days.

(21) Appl. No.: 16/488,388

(22) PCT Filed: May 7, 2019

(86) PCT No.: PCT/CN2019/085742
§ 371 (c)(1),
(2) Date: Aug. 23, 2019

(87) PCT Pub. No.: WO2020/181640
PCT Pub. Date: Sep. 17, 2020

(65) Prior Publication Data
US 2021/0406502 A1  Dec. 30, 2021

(30) Foreign Application Priority Data

Mar. 13, 2019 (CN) .......................... 201910189145.3

(51) Int. Cl.
*G01J 1/44* (2006.01)
*G06K 9/00* (2022.01)
(Continued)

(52) U.S. Cl.
CPC ......... *G06K 9/0004* (2013.01); *G02F 1/1368* (2013.01); *G02F 1/13324* (2021.01);
(Continued)

(58) Field of Classification Search
CPC .............. G06K 9/0004; G02F 1/13324; G02F 1/13338; G02F 1/13624; G02F 1/1368;
(Continued)

(56) References Cited

U.S. PATENT DOCUMENTS

| 2015/0369661 | A1* | 12/2015 | Lin | ...................... | G06K 9/0004 |
| | | | | | 250/227.11 |
| 2018/0329585 | A1 | 11/2018 | Carrigan et al. | | |
| 2019/0305156 | A1 | 10/2019 | Ren et al. | | |

FOREIGN PATENT DOCUMENTS

| CN | 201222703 Y | 4/2009 |
| CN | 108470783 A | 8/2018 |

* cited by examiner

*Primary Examiner* — Abdul-Samad A Adediran
(74) *Attorney, Agent, or Firm* — Benesch, Friedlander, Coplan & Aronoff LLP

(57) ABSTRACT

A display device includes a display screen including sub-pixel units, a storage battery unit, and a control chip. The sub-pixel units include gate lines and fingerprint signal lines intersecting with each other, transistors, solar battery modules each of which includes a first electrode, a light-sensing device for transferring light signals into electrical signals, and a second electrode overlapping sequentially, and light-emitting devices disposed at intervals from the solar battery modules. A gate electrode, a drain electrode, and a source electrode of each transistor connect to the gate line, the first electrode, and the control chip respectively. The storage battery unit connects to the first and second electrodes. When light from the light-emitting device is reflected off fingers and is back toward the light-sensing device, the transistor is turned on, the light-sensing device generates (Continued)

fingerprint signals, and the control chip stores and recognizes the fingerprint signals.

18 Claims, 7 Drawing Sheets

(51) Int. Cl.
*H01L 27/32* (2006.01)
*G02F 1/1368* (2006.01)
*G02F 1/1362* (2006.01)
*G02F 1/133* (2006.01)
*G02F 1/1333* (2006.01)
*H01L 27/146* (2006.01)

(52) U.S. Cl.
CPC ...... *G02F 1/13338* (2013.01); *G02F 1/13624* (2013.01); *H01L 27/3227* (2013.01); *H01L 27/3234* (2013.01); *H01L 27/3244* (2013.01); *H01L 27/14678* (2013.01)

(58) Field of Classification Search
CPC ............ H01L 27/3227; H01L 27/3234; H01L 27/3244; H01L 27/14678
USPC ..................................................... 250/227.11
See application file for complete search history.

DISPLAY DEVICE FOR INTEGRATING A SOLAR BATTERY MODULE WITH A FUNCTION OF RECOGNIZING FINGERPRINTS

CROSS REFERENCE TO RELATED APPLICATION

This application claims the priority of International Application No. PCT/CN2019/085742, filed on 2019 May 7, which claims priority to Chinese Application No. 201910189145.3 filed on 2019 Mar. 13. The entire disclosures of each of the above applications are incorporated herein by reference.

BACKGROUND OF DISCLOSURE

1. Field of Disclosure

The present disclosure relates to the field of display technology, and more particularly, to a display device for integrating a solar battery module with a function of recognizing fingerprints.

2. Description of Related Art

In recent years, there has been an increasing interest in full screen display devices. However, to display devices with a function of recognizing fingerprints, fingerprint recognition modules need to be arranged in specific areas, so the effect of full screen is not easy to be realized.

Furthermore, problems of fast power consumption are commonly existed in conventional display devices. When display devices are charged, it is not convenient for users to charge the display devices through charging devices or mobile power devices.

Therefore, it is necessary to provide a display device for integrating a solar battery module with a function of recognizing fingerprints to solve the above problems.

SUMMARY

A technical problem is that, to display devices with a function of recognizing fingerprints, fingerprint recognition modules need to be arranged in specific areas, so the effect of full screen is not easy to be realized. Furthermore, problems of fast power consumption are commonly existed in conventional display devices. When display devices are charged, it is not convenient for users to charge the display devices through charging devices or mobile power devices.

The object of the present disclosure is to provide a display device for integrating a solar battery module with a function of recognizing fingerprints to give users more convenience to use.

In order to realize the above object, the present disclosure provides a display device including a display screen, a storage battery unit, and a control chip. The display screen includes a plurality of sub-pixel units, wherein each of the plurality of sub-pixel units includes: a gate line and a fingerprint signal line which intersect with each other; a transistor, wherein a gate electrode of the transistor is electrically connected to the gate line; a solar battery module including a first electrode, a light-sensing device, and a second electrode which overlap sequentially, wherein the first electrode is electrically connected to a drain electrode of the transistor, and wherein the light-sensing device is configured to transfer a light signal into an electrical signal; and a light-emitting device disposed at an interval from the solar battery module; a storage battery unit electrically connected to the first electrode and the second electrode; and a control chip electrically connected to a source electrode of the transistor through the fingerprint signal line; wherein when light emitted from the light-emitting device is reflected off a finger which touches the display screen and then back toward the light-sensing device, the transistor is turned on, the light-sensing device generates a corresponding fingerprint signal, and the control chip stores and recognizes the corresponding fingerprint signal.

In some embodiments, when the finger does not touch the display screen, the transistor is turned off, and the storage battery unit stores the electrical signal generated from the light-sensing device.

In some embodiments, the control chip is electrically connected to the gate electrode of the transistor through the gate line.

In some embodiments, the display device further includes an array substrate, wherein the transistor and the solar battery module are formed on the array substrate in sequence, and wherein the drain electrode of the transistor is electrically connected to the first electrode through a through-hole.

In some embodiments, the light-sensing device is a light-sensing diode.

In some embodiments, two ends of the light-sensing diode are electrically connected to the first electrode and the second electrode respectively.

In some embodiments, the light-sensing device includes at least one material selected from a group consisting of an amorphous silicon thin-film, a copper indium selenium (CIS) thin-film, a copper indium gallium selenium (CIGS) thin-film, and a cadmium telluride (CdTe) thin-film.

In some embodiments, a material of the second electrode is a transparent conductive material.

In some embodiments, the second electrode is of a grating structure.

In some embodiments, the display screen is an organic light-emitting diode display screen or a liquid crystal display screen.

In order to realize the above object, the present disclosure provides a display device, including: a display screen including a plurality of sub-pixel units, each of the plurality of sub-pixel units including: a gate line and a fingerprint signal line which intersect with each other; a transistor, wherein a gate electrode of the transistor is electrically connected to the gate line; a solar battery module including a first electrode, a light-sensing device, and a second electrode which overlap sequentially, wherein the first electrode is electrically connected to a drain electrode of the transistor, and wherein the light-sensing device is configured to transfer a light signal into an electrical signal; and a light-emitting device disposed at an interval from the solar battery module; a storage battery unit electrically connected to the first electrode and the second electrode; and a control chip electrically connected to a source electrode of the transistor through the fingerprint signal line and to the gate electrode of the transistor through the gate line; wherein when light emitted from the light-emitting device is reflected off a finger which touches the display screen and then back toward the light-sensing device, the transistor is turned on, the light-sensing device generates a corresponding fingerprint signal, and the control chip stores and recognizes the corresponding fingerprint signal; and wherein when the finger does not touch the display screen, the transistor is turned off, and the storage battery unit stores the electrical signal generated from the light-sensing device.

In some embodiments, the display device further includes an array substrate, wherein the transistor and the solar battery module are formed on the array substrate in sequence, and wherein the drain electrode of the transistor is electrically connected to the first electrode through a through-hole.

In some embodiments, the light-sensing device is a light-sensing diode.

In some embodiments, two ends of the light-sensing diode are electrically connected to the first electrode and the second electrode respectively.

In some embodiments, the light-sensing device includes at least one material selected from a group consisting of an amorphous silicon thin-film, a copper indium selenium (CIS) thin-film, a copper indium gallium selenium (CIGS) thin-film, and a cadmium telluride (CdTe) thin-film.

In some embodiments, a material of the second electrode is a transparent conductive material.

In some embodiments, the second electrode is of a grating structure.

In some embodiments, the display screen is an organic light-emitting diode display screen or a liquid crystal display screen.

The beneficial effect of the present disclosure is that, a display device for integrating a solar battery module with a function of recognizing fingerprints is provided to give users more convenience to use.

BRIEF DESCRIPTION OF DRAWINGS

To ensure the features and the technical content of the disclosure are more apparent and easier to understand, please refer to the explanation and the accompanying drawings of the disclosure as follows. However, the accompanying drawings are merely for reference without limiting the disclosure.

DETAILED DESCRIPTION OF EMBODIMENTS

To ensure the objects, the technical solutions, and the effects of the disclosure are clearer and more specific, the disclosure will be explained in conjunction with the accompanying drawings in detail further below. It should be understood that the embodiments described herein are merely a part of the embodiments of the present disclosure instead of all of the embodiments and not used to limit the disclosure.

Figure 1:
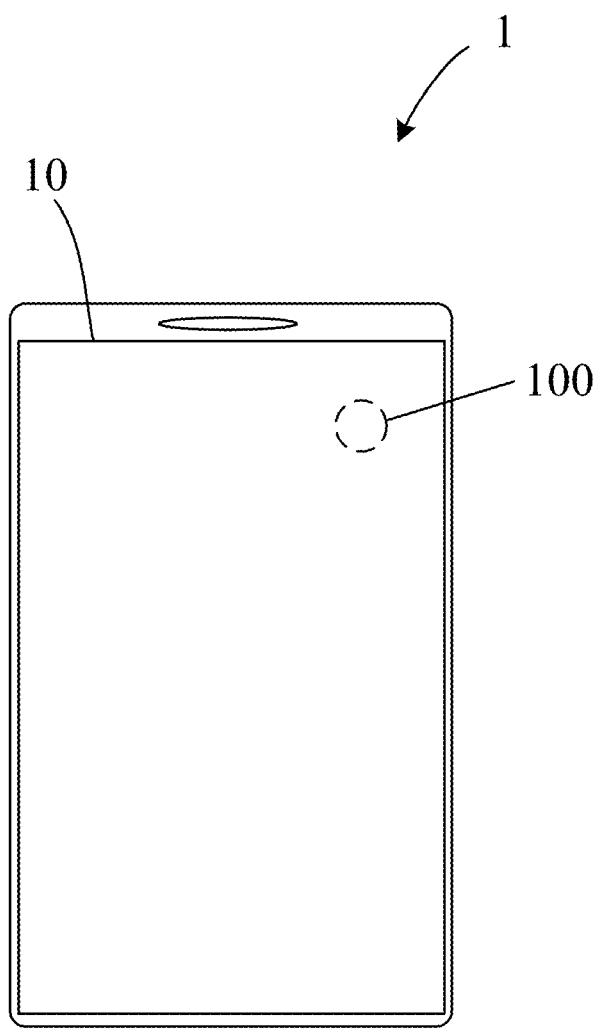
FIG. 1 is a schematic diagram of a display device according to an embodiment of the present disclosure.

Please refer to FIG. 1, which is a schematic diagram of a display device according to an embodiment of the present disclosure. As shown in FIG. 1, a display device 1 includes a display screen 10. The display screen 10 includes a plurality of sub-pixel units 100. In some embodiments, the display screen 10 can be an organic light-emitting diode display screen or a liquid crystal display screen.

Figure 2A:
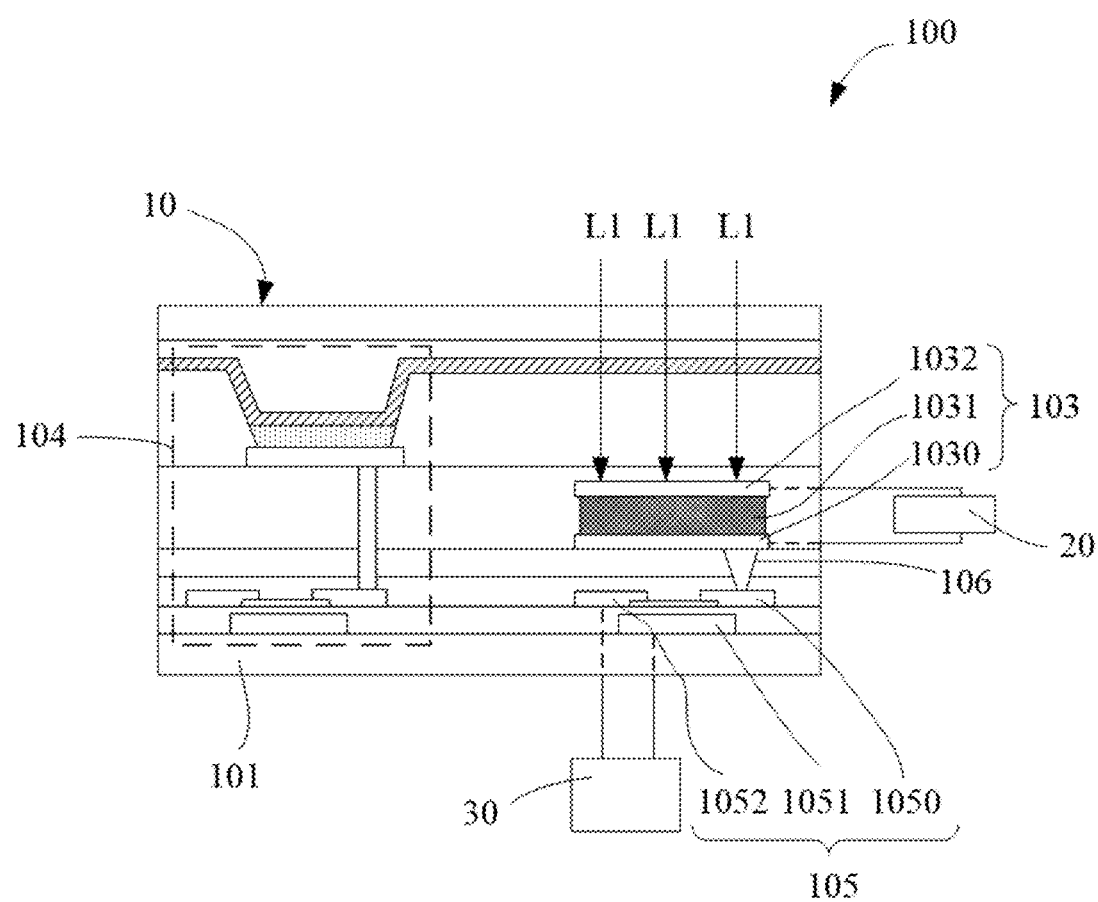
FIG. 2A is a cross-sectional view of a sub-pixel unit under the condition of being charged by solar energy according to a first embodiment of the present disclosure.

Please refer to FIG. 2A, which is a cross-sectional view of a sub-pixel unit under the condition of being charged by solar energy according to a first embodiment of the present disclosure. The display device 1 includes the display screen 10, a storage battery unit 20, and a control chip 30. Furthermore, the sub-pixel unit 100 includes a transistor 105, a solar battery module 103, and a light-emitting device 104. The solar battery module 103 includes a first electrode 1030, a light-sensing device 1031, and a second electrode 1032 which overlap sequentially. As shown in FIG. 2A, the first electrode 1030 is electrically connected to a drain electrode 1050 of the transistor 105. The light-sensing device 1031 is configured to transfer a light signal into an electrical signal. The light-emitting device 104 is disposed at an interval from the solar battery module 103. The storage battery unit 20 is electrically connected to the first electrode 1030 and the second electrode 1032.

Continuing to refer to FIG. 2A, the display device 1 further includes an array substrate 101. In the present embodiment, the transistor 105 and the solar battery module 103 are formed on the array substrate 101 in sequence, and the drain electrode 1050 of the transistor 105 is electrically connected to the first electrode 1030 through a through-hole 106. In some embodiments, the light-sensing device 1031 is a separate light-sensing diode, and two ends of the light-sensing diode are electrically connected to the first electrode 1030 and the second electrode 1032 respectively.

In FIG. 2A, when a finger does not touch the display screen 10, solar light L1 casts on a surface of the light-sensing device 1031 so that the light-sensing device 1031 generates an electrical signal or a current. Then, the storage battery unit 20 stores the electrical signal generated from the light-sensing device 1031. That is, the storage battery unit 20 is being charged. At this moment, the transistor 105 is turned off, and the display device 1 does not execute a function of recognizing fingerprints.

Figure 2B:
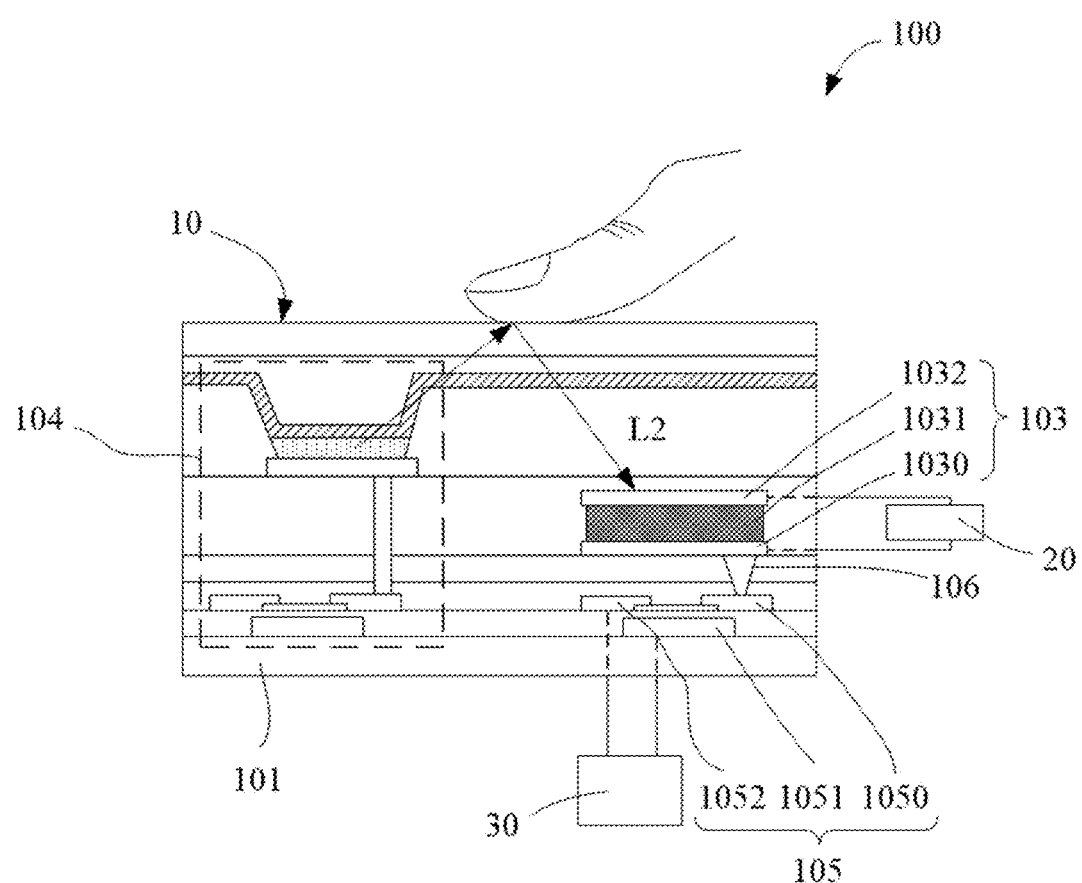
FIG. 2B is a cross-sectional view of the sub-pixel unit under the condition of recognizing fingerprints according to the first embodiment of the present disclosure.

Please refer to FIG. 2B, which is a cross-sectional view of the sub-pixel unit under the condition of recognizing fingerprints according to the first embodiment of the present disclosure. When light L2 emitted from the light-emitting device 104 is reflected off the finger which touches the display screen 10 and then back toward the light-sensing device 1031, the transistor 105 is turned on, the light-sensing device 1031 generates a corresponding fingerprint signal, and the control chip 30 stores and recognizes the fingerprint signal. At the same time, when the light L2 emitted from the light-emitting device 104 is reflected off the finger which touches the display screen 10 and then back toward the light-sensing device 1031, a current is also generated to charge the storage battery unit 20.

Figure 2C:
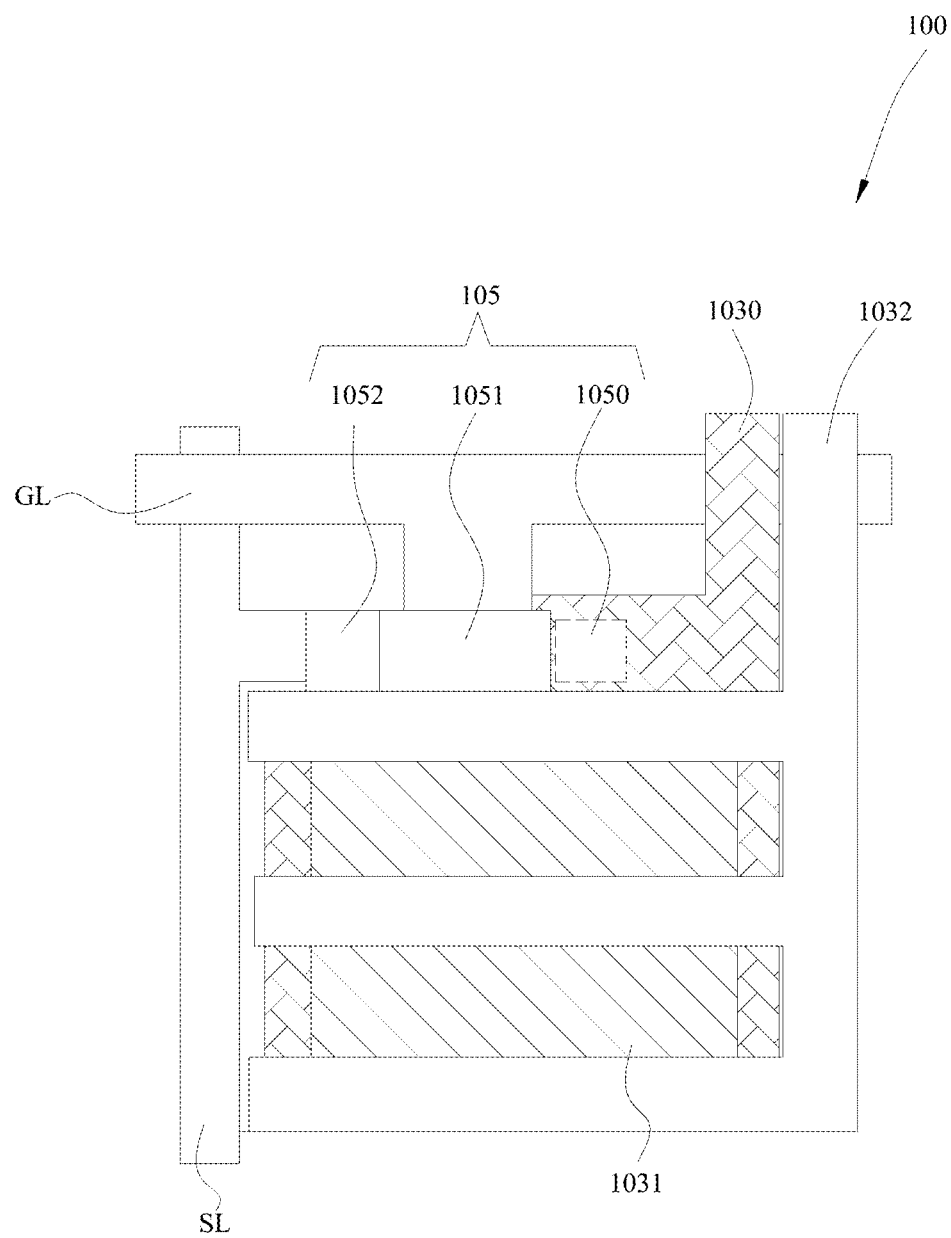
FIG. 2C is a partially perspective view of the sub-pixel unit shown in FIG. 1.

Please refer to FIG. 2C, which is a partially perspective view of the sub-pixel unit shown in FIG. 1. In the present embodiment, the second electrode 1032 can be of a grating structure in order to ensure that the solar light L1 and the light L2 emitted from the light-emitting device 104 can cast on the surface of the light-sensing device 1031 and to reduce contact resistance between the second electrode 1032 and the light-sensing device 1031. Specifically, a material of the second electrode 1032 is a transparent conductive material. The light-sensing device 1031 includes at least one material selected from a group consisting of an amorphous silicon thin-film, a copper indium selenium (CIS) thin-film, a copper indium gallium selenium (CIGS) thin-film, and a cadmium telluride (CdTe) thin-film.

Figure 3:
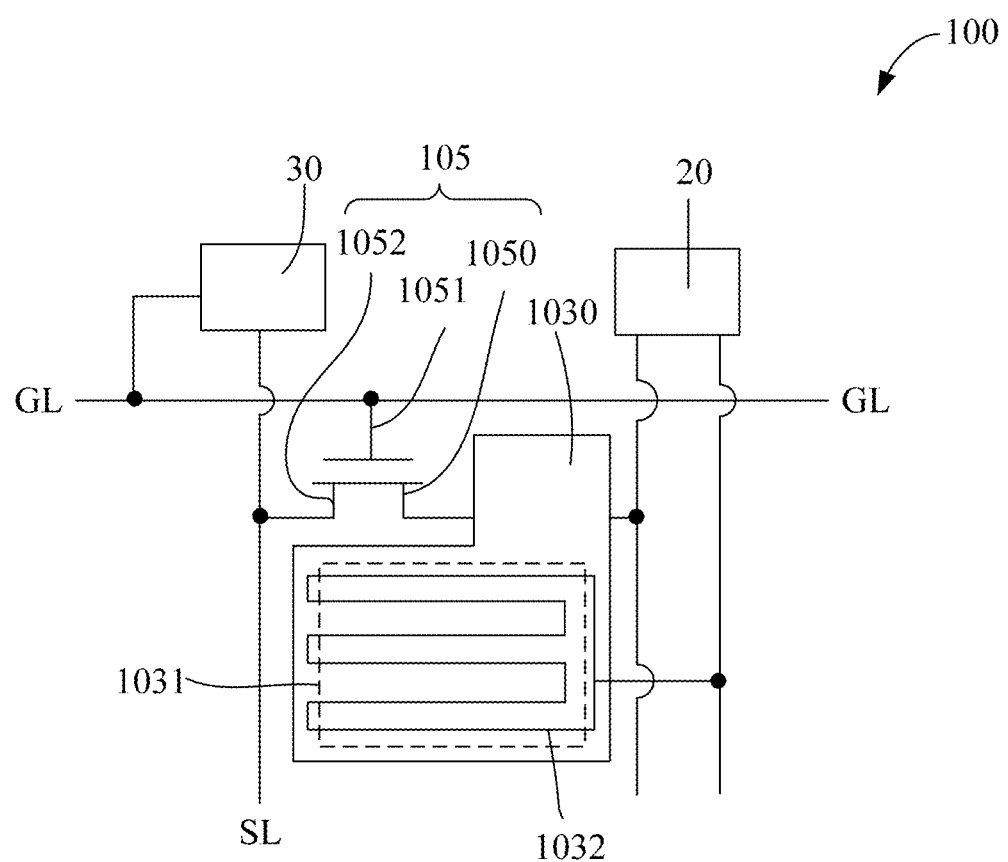
FIG. 3 is an equivalent circuit diagram of the sub-pixel unit shown in FIG. 1.

Please refer to FIG. 3, which is an equivalent circuit diagram of the sub-pixel unit shown in FIG. 1. Also referring to FIG. 3 and FIG. 2C, the sub-pixel unit 100 includes a gate line GL and a fingerprint signal line SL which intersect with each other. A gate electrode 1051 of the transistor 105 is electrically connected to the gate line GL. The control chip 30 is electrically connected to a source electrode 1052 of the transistor 105 through the fingerprint signal line SL. The first electrode 1030 is electrically connected to the drain electrode 1050 of the transistor 105. In the present embodiment, the control chip 30 can be further configured to be electrically connected to the gate electrode 1051 of the transistor 105 through the gate line GL in order to provide a gate scan signal.

Figure 4A:
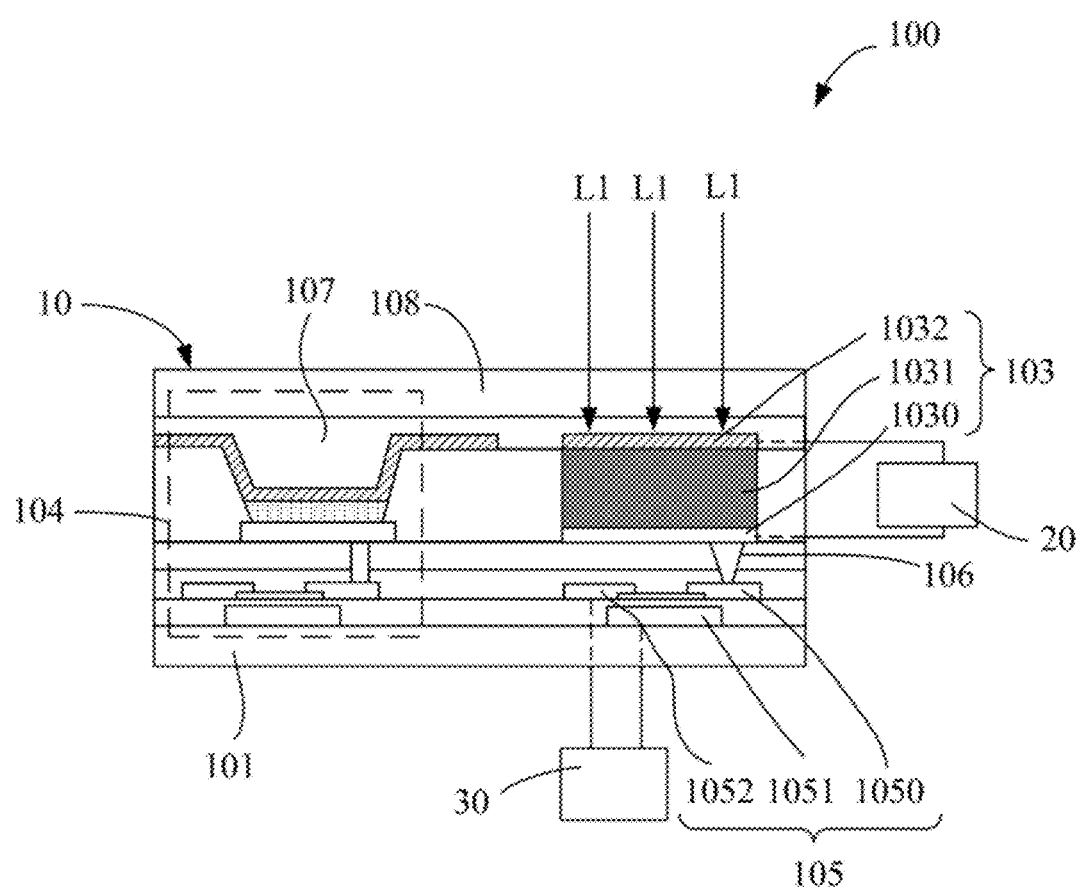
FIG. 4A is a cross-sectional view of a sub-pixel unit under the condition of being charged by solar energy according to a second embodiment of the present disclosure.

FIG. 4A is a cross-sectional view of a sub-pixel unit under the condition of being charged by solar energy according to a second embodiment of the present disclosure. The difference between FIG. 4A and FIG. 2A is that the light-emitting device 104 and the solar battery module 103 are disposed in the same layer (as shown in FIG. 4A) and directly adhere to a cover plate 108 through optical adhesive 107, causing manufacturing costs to be reduced and making the display device 1 lighter and thinner. The operation method of FIG. 4A is the same as that of FIG. 2A and is not repeated here.

Figure 4B:
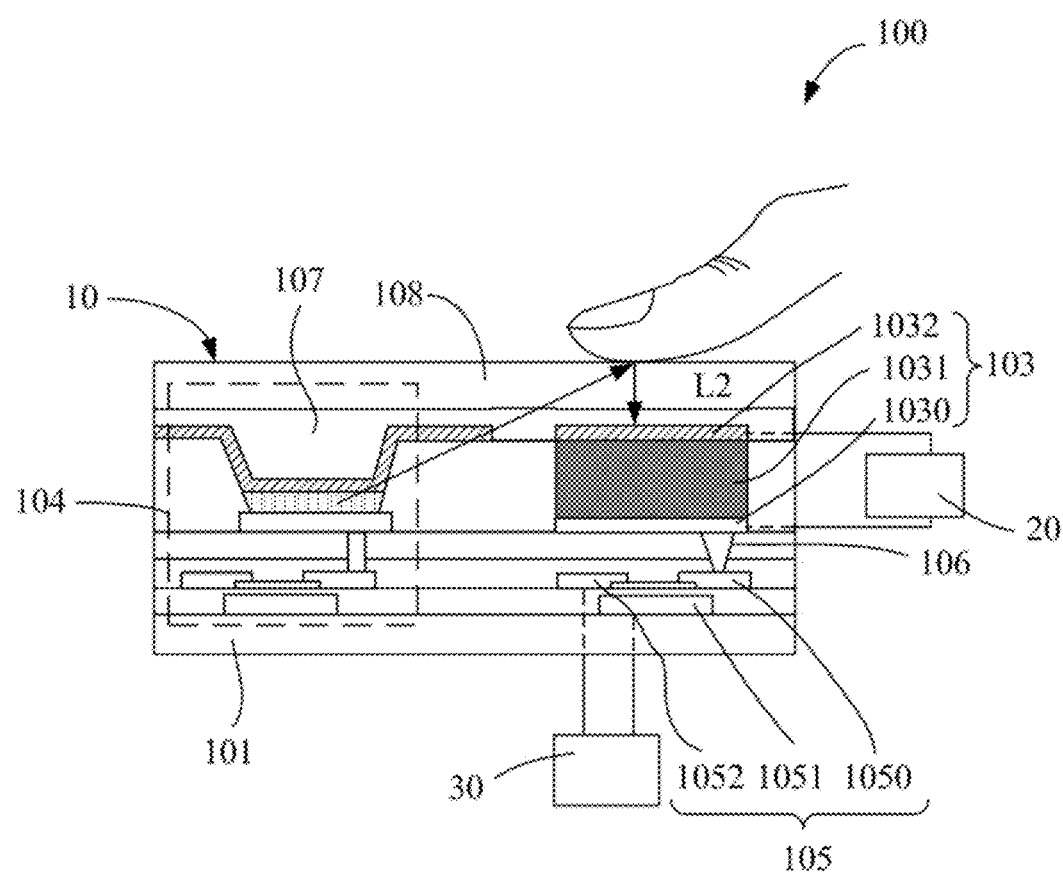
FIG. 4B is a cross-sectional view of the sub-pixel unit under the condition of recognizing fingerprints according to the second embodiment of the present disclosure.

FIG. 4B is a cross-sectional view of the sub-pixel unit under the condition of recognizing fingerprints according to the second embodiment of the present disclosure. The difference between FIG. 4B and FIG. 2B is that the light-emitting device 104 and the solar battery module 103 are disposed in the same layer (as shown in FIG. 4B) and directly adhere to a cover plate 108 through optical adhesive 107, causing manufacturing costs to be reduced and making the display device 1 lighter and thinner. The operation method of FIG. 4B is the same as that of FIG. 2B and is not repeated here.

In conclusion, the present disclosure provides a display device mainly through integrating a solar battery module with a function of recognizing fingerprints, without arranging fingerprint recognition modules in specific areas and without charging the display device through charging devices. Thus, the display device gives users more convenience to use.

It should be understood that the application of the present disclosure is not limited by the foregoing examples. A person of ordinary skill in the art is able to make modifications or changes based on the foregoing description, and all of these modifications and changes are within the scope of the appended claims of the present disclosure.

The industrial applicability of the present disclosure is that, for the display device provided in the present disclosure, the fingerprint recognition modules do not need to be arranged in specific areas, and the display device do not need to be charged through the charging devices. Thus, the display device can give users more convenience to use.

What is claimed is:

1. A display device, comprising:
   a display screen comprising a plurality of sub-pixel units, each of the plurality of sub-pixel units comprising:
      a gate line and a fingerprint signal line which intersect with each other;
      a transistor, wherein a gate electrode of the transistor is electrically connected to the gate line;
      a solar battery module comprising a first electrode, a light-sensing device, and a second electrode which overlap sequentially, wherein the first electrode is electrically connected to a drain electrode of the transistor, and wherein the light-sensing device is configured to transfer a light signal into an electrical signal; and
      a light-emitting device disposed at an interval from the solar battery module;
   a storage battery unit electrically connected to the first electrode and the second electrode; and
   a control chip electrically connected to a source electrode of the transistor through the fingerprint signal line;
   wherein when light emitted from the light-emitting device is reflected off a finger which touches the display screen and then back toward the light-sensing device, the transistor is turned on, the light-sensing device generates a corresponding fingerprint signal, and the control chip stores and recognizes the corresponding fingerprint signal.

2. The display device of claim 1, wherein when the finger does not touch the display screen, the transistor is turned off, and the storage battery unit stores the electrical signal generated from the light-sensing device.

3. The display device of claim 1, wherein the control chip is electrically connected to the gate electrode of the transistor through the gate line.

4. The display device of claim 1, further comprising an array substrate, wherein the transistor and the solar battery module are formed on the array substrate in sequence, and wherein the drain electrode of the transistor is electrically connected to the first electrode through a through-hole.

5. The display device of claim 1, wherein the light-sensing device is a light-sensing diode.

6. The display device of claim 5, wherein two ends of the light-sensing diode are electrically connected to the first electrode and the second electrode respectively.

7. The display device of claim 1, wherein the light-sensing device comprises at least one material selected from a group consisting of an amorphous silicon thin-film, a copper indium selenium (CIS) thin-film, a copper indium gallium selenium (CIGS) thin-film, and a cadmium telluride (CdTe) thin-film.

8. The display device of claim 1, wherein a material of the second electrode is a transparent conductive material.

9. The display device of claim 1, wherein the second electrode is of a grating structure.

10. The display device of claim 1, wherein the display screen is an organic light-emitting diode display screen or a liquid crystal display screen.

11. A display device, comprising:
   a display screen comprising a plurality of sub-pixel units, each of the plurality of sub-pixel units comprising:
      a gate line and a fingerprint signal line which intersect with each other;
      a transistor, wherein a gate electrode of the transistor is electrically connected to the gate line;
      a solar battery module comprising a first electrode, a light-sensing device, and a second electrode which overlap sequentially, wherein the first electrode is electrically connected to a drain electrode of the transistor, and wherein the light-sensing device is configured to transfer a light signal into an electrical signal; and
      a light-emitting device disposed at an interval from the solar battery module;

a storage battery unit electrically connected to the first electrode and the second electrode; and a control chip electrically connected to a source electrode of the transistor through the fingerprint signal line and to the gate electrode of the transistor through the gate line;

wherein when light emitted from the light-emitting device is reflected off a finger which touches the display screen and then back toward the light-sensing device, the transistor is turned on, the light-sensing device generates a corresponding fingerprint signal, and the control chip stores and recognizes the corresponding fingerprint signal; and wherein when the finger does not touch the display screen, the transistor is turned off, and the storage battery unit stores the electrical signal generated from the light-sensing device.

12. The display device of claim 11, further comprising an array substrate, wherein the transistor and the solar battery module are formed on the array substrate in sequence, and wherein the drain electrode of the transistor is electrically connected to the first electrode through a through-hole.

13. The display device of claim 11, wherein the light-sensing device is a light-sensing diode.

14. The display device of claim 13, wherein two ends of the light-sensing diode are electrically connected to the first electrode and the second electrode respectively.

15. The display device of claim 11, wherein the light-sensing device comprises at least one material selected from a group consisting of an amorphous silicon thin-film, a copper indium selenium (CIS) thin-film, a copper indium gallium selenium (CIGS) thin-film, and a cadmium telluride (CdTe) thin-film.

16. The display device of claim 11, wherein a material of the second electrode is a transparent conductive material.

17. The display device of claim 11, wherein the second electrode is of a grating structure.

18. The display device of claim 11, wherein the display screen is an organic light-emitting diode display screen or a liquid crystal display screen.

* * * * *